United States Patent [19]

Nickel et al.

[11] 4,337,517

[45] Jun. 29, 1982

[54] METHOD OF AUTOMATICALLY CALIBRATING A MICROPROCESSOR CONTROLLED DIGITAL MULTIMETER

[75] Inventors: Walter Nickel, Walnut Creek; Zoltan Tarczy-Hornoch, Berkeley, both of Calif.

[73] Assignee: Systron Donner Corporation, Concord, Calif.

[21] Appl. No.: 86,722

[22] Filed: Oct. 22, 1979

Related U.S. Application Data

[63] Continuation-in-part of Ser. No. 724,005, Sep. 16, 1976, Pat. No. 4,200,933, which is a continuation-in-part of Ser. No. 710,218, Jul. 30, 1976, abandoned.

[51] Int. Cl.³ .................... G01R 35/00; G06F 15/20
[52] U.S. Cl. ............................. 364/571; 324/99 D; 324/130
[58] Field of Search ............... 364/481, 483, 571, 573, 364/582; 324/63, 73 R, 73 AT, 74, 78 D, 79 D, 99 D, 99 R, 115, 116, 130; 73/1 R; 371/8, 20

[56] References Cited

U.S. PATENT DOCUMENTS

| | | | |
|---|---|---|---|
| 2,951,200 | 8/1960 | Critchlow | 364/571 X |
| 3,409,829 | 11/1968 | Elmore et al. | 324/74 |
| 3,777,261 | 12/1973 | Strenglein et al. | 324/130 X |
| 4,038,532 | 7/1977 | Burris et al. | 364/571 X |
| 4,127,811 | 11/1978 | Gockin, Jr. et al. | 325/130 |

OTHER PUBLICATIONS

Julie, "A High Accuracy Digital Instrument Design for DC Measurements"-IEEE Trans. on Instrumentation and Measurement, vol. IM-21, No. 4, Nov. 72, pp. 323-328.

Vallo et al., "High Power Laboratory Testing with a Real-Time Computer", IEEE Trans. on Power Apparatus and Systems, vol. PAS-95, No. 3, pp. 982-987, May-Jun. 1976.

Kaufmann, "Analogue Voltages Monitored by Microprocessor", Electronic Engineering, vol. 48, No. 580, pp. 23, 25, 27, Jun. 1976.

Inoue et al., "An Automated Precision Power Measurement and Power Meter Calibration System in the Milometer-Wave Region", 1976 Conf. on Precision Measuring, etc., Boulder, Colo., (Jun. 28-Jul. 1, 1976).

*Primary Examiner*—Joseph F. Ruggiero
*Attorney, Agent, or Firm*—Flehr, Hohbach, Test, Albritton & Herbert

[57] ABSTRACT

A new microprocessor controlled digital multimeter offers significant advantages to the user. Automatic calibration allows a new reference IC board to be inserted and because of such calibration the multimeter is instantly ready for use.

1 Claim, 7 Drawing Figures

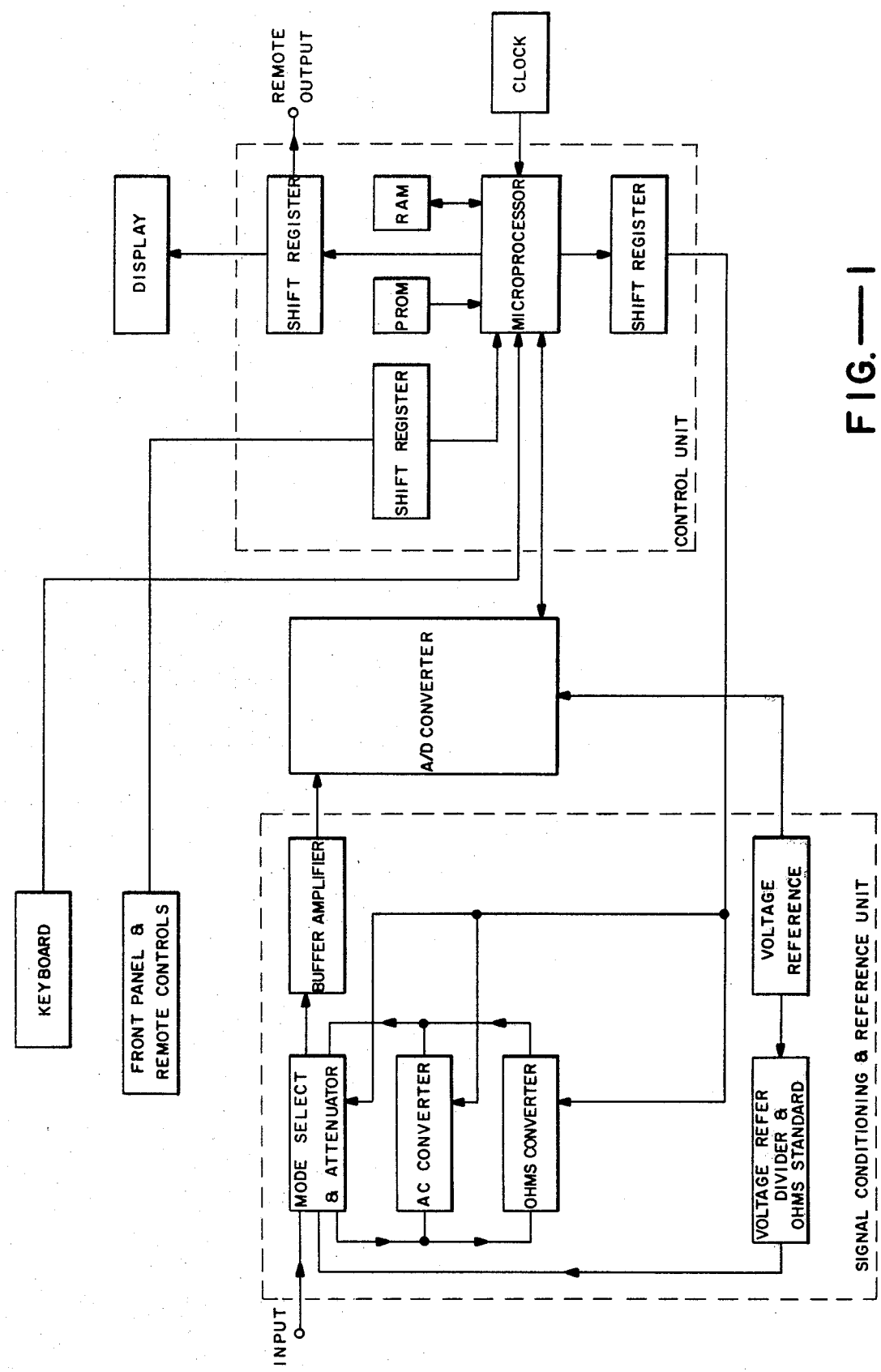
FIG.—1

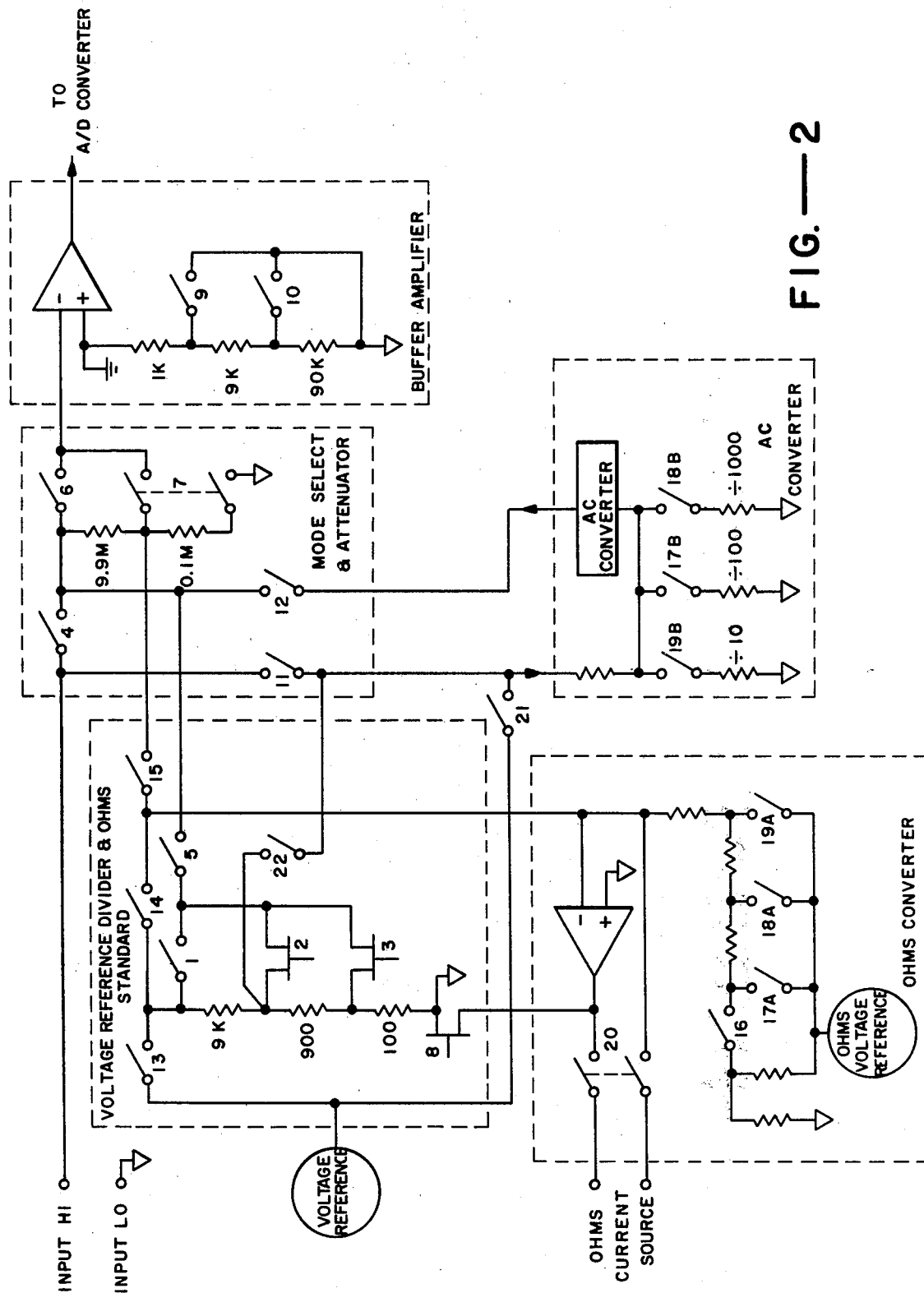
FIG.—2

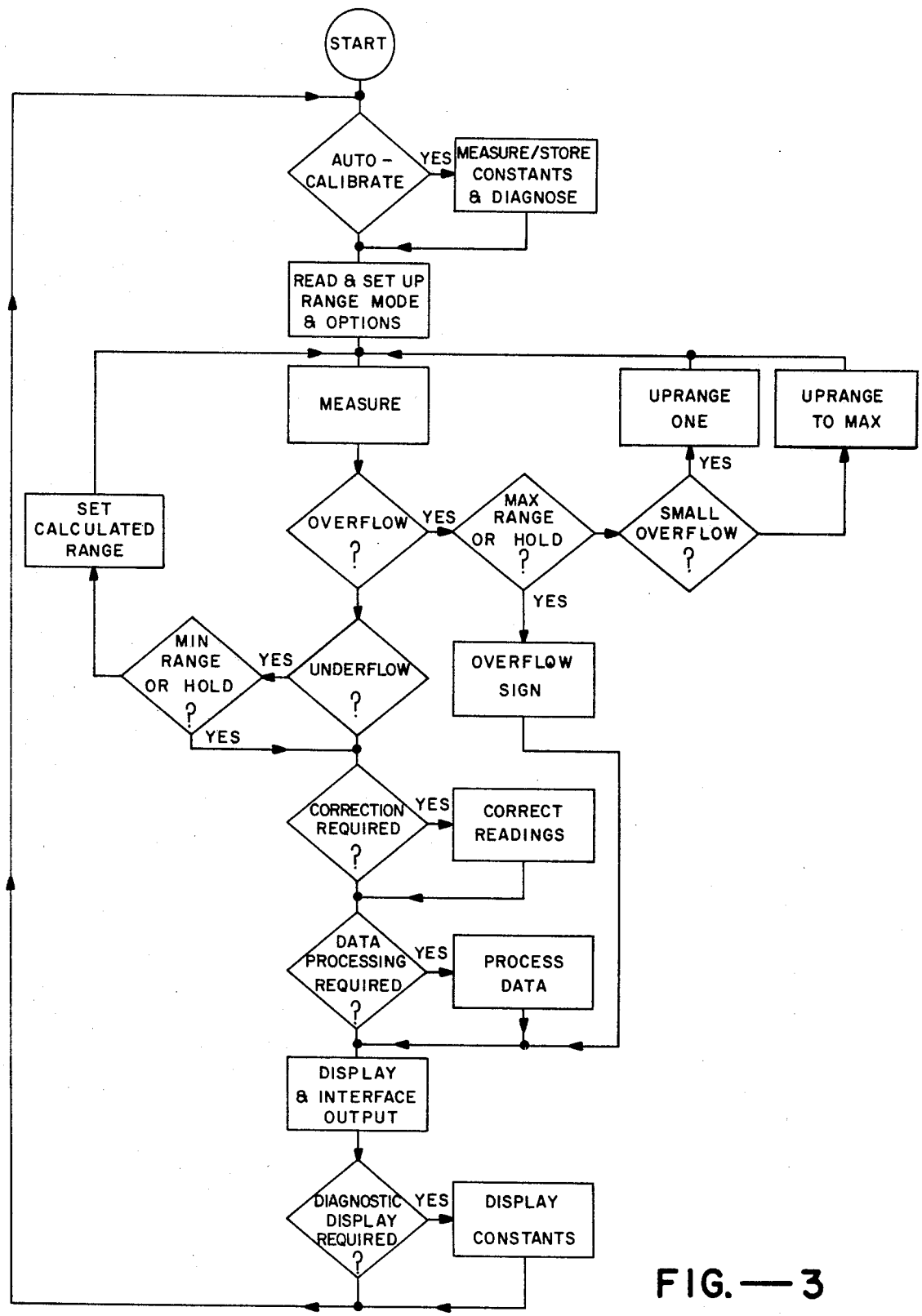
FIG.—3

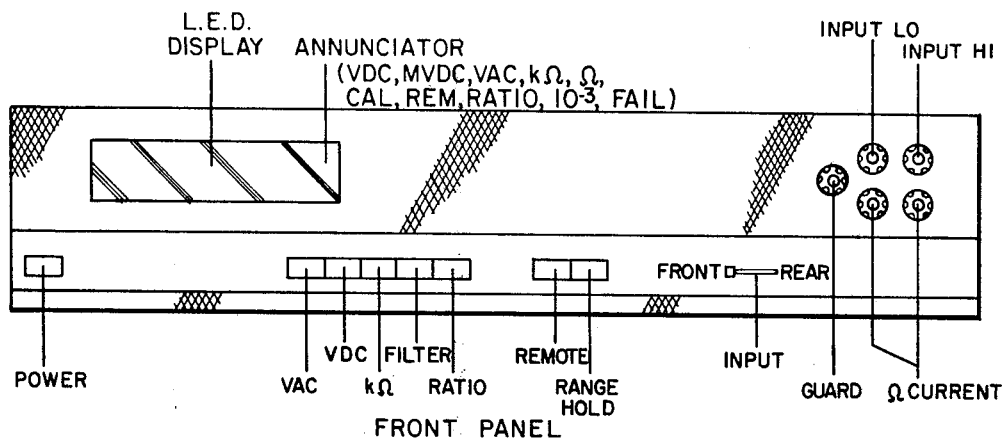

FIG.—4

| | | | | |
|---|---|---|---|---|
| $A_1$ (0.1 Vdc GAIN) | = $(A-E)10^{-5}$ ① | | $J_1$ (1kΩ S.F.) | = $(J-G)10^{-5}$ |
| $B_1$ (1 Vdc GAIN) | = $(B-F)10^{-5}$ | | $K_1$ (10kΩ S.F.) | = $(K-G)10^{-5}$ |
| $C_1$ (10 Vdc GAIN) | = $(C-F/10-180)10^{-5}$ | | $L_1$ (100kΩ S.F.) | = $(L-G)10^{-5}$ |
| $D_1$ (DC ATTEN S.F.) ② | = $(D-E)(2-A_1)10^{-5}$ | | $M_1$ (Vac ZERO) | = $(M-1200)$ |
| $E_1$ (0.1 Vdc ZERO) | = $E-200$ | | $N_1$ (1 Vac GAIN) | = $(N-M)10^{-5}$ |
| $F_1$ (1 Vac ZERO) | = $F-200$ | | $P_1$ (10 Vac ATTEN S.F.) | = $(P-M)10^{-5}$ |
| $G_1$ (kΩ ZERO) | = $G-200$ | | $R_1$ (100 Vac ATTEN S.F.) | = $(R-M)10^{-5}$ |
| $H_1$ (0.1 kΩ S.F.) | = $(H-G)10^{-5}$ | | $S_1$ (1000 Vac ATTEN S.F.) | = $(S-M)10^{-5}$ |

1 SEE TABLE IV FOR SOURCE OF UNSUBSCRIPTED CONSTANTS
2 SCALE FACTOR (S.F.)

FIG.—5

| VDC | .1 | 1 | 10 | 100 | 1000 | |
|---|---|---|---|---|---|---|
| X | $E_1$ | $F_1$ | $F_1/10$ | $F_1$ | $F_1/10$ | |
| Y | $(2-A_1)$ | $(2-B_1)$ | $(2-C_1)$ | $(2-B_1)(2-D_1)$ | $(2-C_1)(2-D_1)$ | |
| kΩ | .1 | 1 | 10 | 100 | 1000 | 10,000 |
| X | $G_1$ | $G_1$ | $G_1$ | $G_1$ | $G_1/10$ | $G_1/100$ |
| Y | $(2-H_1)$ | $(2-J_1)$ | $(2-K_1)$ | $(2-L_1)$ | $A_1(2-L_1)(2-B_1)$ | $A_1(2-L_1)(2-C_1)$ |
| VAC | | 1 | 10 | 100 | 1000 | |
| X | | $M_1$ | $M_1$ | $M_1$ | $M_1$ | |
| Y | | $(2-N_1)$ | $(2-P_1)$ | $A_1(2-B_1)(2-R_1)$ | $A_1(2-B_1)(2-S_1)$ | |

$R_{CORR} = [\pm(|R_{UNCORR}|-200)-X]Y$

UNIVERSAL CORRECTION EQUATION AND DEFINITION OF THE XANDY CONSTANTS

FIG.—6

FIG.—7  SWITCH SETUP TABLE

| OPERATING MODES | FUNCTION | RANGE | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|---|
| | VDC | 0.1 | | | | × | × | × | | | | | | | | | | | | | | | | |
| | | 1 | | | | × | × | × | × | | | | | | | | | | | | | | | |
| | | 100 | | | × | × | × | × | × | | | | | | | | | | | | | | | |
| | | 1000 | | | × | × | | | | | | | | | | | | | | | | | | |
| | VAC | 1 | | | | × | × | × | | | × | × | × | × | | | | | | | | | | |
| | | 10 | | | | × | × | × | | | | × | × | × | × | | | | | | | | | |
| | | 100 | | | | × | × | × | | | | | × | × | × | × | | | | | | | | |
| | | 1000 | | | | × | × | × | | | | | | × | × | × | × | | | | | | | |
| | kΩ | 0.1 | | | | | × | × | | | | × | | | | | | | × | | | | | |
| | | 1 | | | | | × | × | | | × | | | | | | | | | × | | | | |
| | | 10 | | | | | × | × | | | × | | | | | | | | | | × | | | |
| | | 100 | | | | | × | × | | | × | | | | | | | | | | | × | | |
| | | 1000 | | | | | | × | | | | | | | | | | | | | × | × | × | |
| | | 10,000 | | | | | | | | | | | | | | | | | | | | × | × | × |

| AUTO CALIBRATION MODES | MODE | FACTOR | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|---|
| | 0.1 Vdc GAIN | A | | × | | | × | × | | × | × | × | | | | | | | | | | | | |
| | 1 Vdc GAIN | B | | | × | | × | × | × | × | × | × | | | | | | | | | | | | |
| | 1 Vdc GAIN | C | | | × | | × | × | × | × | × | × | | | | | | | | | | | | |
| | DC ATTEN | D | | | | × | × | × | | | × | | | | | | | | | | | | | |
| | 0.1 Vdc ZERO | E | × | | | | | | | | × | | | | × | × | × | | | | | | | |
| | 1.0 Vdc ZERO | F | × | | | | | | | | | × | | | | × | × | × | | | | | | |
| | kΩ ZERO | G | | × | | | × | × | | | × | | | × | × | × | | | | | | | | |
| | 0.1 kΩ S.F. | H | | | × | | × | × | × | × | × | | | × | × | | | | | | | | | |
| | 1 kΩ S.F. | J | | | × | | × | × | × | × | × | × | | | × | | | | | | | | | |
| | 10 kΩ S.F. | K | | | | | | | | | | | | | | | | | | | | | | |
| | 100 kΩ S.F. | L | | | | | | | | | | | | | | | | | | | | | | |
| | Vac ZERO | M | | | | | × | × | | | × | × | × | × | × | × | | × | × | | × | | | |
| | 1 Vac GAIN | N | | | | | × | × | | | × | × | × | × | × | × | | | | × | | × | | |
| | 10 Vac ATTEN | P | | | | | × | × | | | | × | × | × | × | × | × | | | | × | | × | |
| | 100 Vac ATTEN | R | | | | | | × | | | | | × | × | × | × | × | × | | | | × | | × |
| | 1000 Vac ATTEN | S | | | | | | | | | | | | × | × | × | × | × | × | | | | × | × |

4,337,517

METHOD OF AUTOMATICALLY CALIBRATING A MICROPROCESSOR CONTROLLED DIGITAL MULTIMETER

CROSS-REFERENCE TO RELATED APPLICATIONS

This is a continuation-in-part of application Ser. No. 724,005, filed Sept. 16, 1976, U.S. Pat. No. 4,200,933, which is a continuation in part of application Ser. No. 710,218 filed July 30, 1976, abandoned, in the names of the present inventors and assigned to the present assignee.

BACKGROUND OF THE INVENTION

The present invention relates to a method of automatically calibrating a microprocessor controlled digital multimeter and more specifically to a method where the system includes self-calibration and diagnostic features.

In the calibration of existing multimeters zero and full scale manual adjustments are made periodically (one week to three month intervals) by use of control knobs and a meter indicating a null condition. This routine is time consuming and complex and does not ensure long term stability. In addition if a parameter or component is seriously outside of tolerable limits the user has no simple diagnostic tool for troubleshooting.

OBJECTS AND SUMMARY OF THE INVENTION

It is a general object of this invention to provide an improved multimeter.

It is a more specific object to provide a multimeter which has self-calibration and diagnostic features.

It is another object of the invention to provide a multimeter which has improved autoranging.

In accordance with the above objects there is provided a method of calibrating a microprocessor controlled digital multimeter. The error is measured in substantially all modes and ranges for substantially all zero and fullscale points between a voltage reference and the actual output of the multimeter including making a plurality of internal self-calibration measurements. The results of such measurements are stored as constants. It is determined which of such constants are relevant with respect to each of the modes and ranges. The relevant constants are utilized for providing digital correction for each of the modes and ranges.

BRIEF DESCRIPTION OF THE DRAWINGS

FIG. 1 is a simplified block diagram of a multimeter embodying the present invention;

FIG. 2 is a circuit schematic of a portion of FIG. 1;

FIG. 3 is a simplified flow chart of the microprocessor program used in the present invention; and FIG. 4 is an elevation view of the front panel of the microprocessor.

FIG. 5 shows the derivation of modified correction constants;

FIG. 6 shows the universal correction equation and definition of the X and Y constants; and FIG. 7 is a switch set-up table.

SYSTEM DESCRIPTION

FIG. 1 shows a simplified block diagram. The Input Attenuator, Mode select, AC and Ω Converter and the Buffer, convert the various input signals to a properly sealed DC voltage input to the A/D Converter. The dual slope A/D Converter compares its input to the Voltage Reference and signals the end of the integrating time. Control circuitry is required to select the proper input switching configuration for each measurement, to generate A/D Converter timing signals and to control the Display.

This control is normally performed by random logic. In this invention a Microprocessor is used as the Control Unit. The inputs and outputs of the processor are formatted and sequenced by shift registers to simplify the interface. The major control tasks performed by the processor include setup of input switching and dual slope timing.

The microprocessor system accepts range and function control signals from the front panel or remote control (i.e., per IEEE 488 standard) and from a ROM lookup table supplies serial data to the range and function switch controlling shift register. These data are decoded and used to drive the switches shown in the analog switch system described later.

AUTO CALIBRATION

System accuracy depends on many factors. Each tap on the resistor networks which control attenuation factors, gain and reference current (Ω mode) contribute error.

The Voltage Reference, with which all inputs are compared, creates an additional error. The number of error-contributing components described above is typically 33 in a conventional precision DMM.

|                      | Precision Resistors | Switches | Reference Elements |
|----------------------|---------------------|----------|--------------------|
| AC Atten and Conv.   | 6                   | 2        |                    |
| DC Atten and Buffer  | 5                   | 2        |                    |
| Ω Converter          | 7                   | 4        | 1                  |
| A/D Converter        | 1                   | 4        |                    |
| Voltage Reference    |                     |          | 1                  |
| Total                | 19                  | 12       | 2                  |

Clearly, any technique to reduce the number of critical components is useful.

The use of Autocalibration as described below in this invention reduces the number of critical components to 5, one Voltage Reference and 4 resistors.

The autocalibration cycle is initiated after every 100th or 1000 measurement of just on external command. There is also one autocalibrate cycle when power is turned on. Autocalibration performs 16 measurements, which cover (after eliminating duplications) all zero and fullscale points of all modes and all ranges. These measurements are taken with a high stability Zener and a resistive divider as the references included in the block labeled "Voltage Reference Divider and Ohms Standard." Since these components are removable they may be replaced with a freshly calibrated pair, thereby eliminating any down time for the instrument while being calibrated. In prior art instruments all circuit boards would have to be replaced which is, of course, impractical. The internal reference elements potentially can also be replaced by external ones. In this case the instrument will never need recalibration. Specifically, the "voltage reference" is typically 10 volts which is divided down by the three precision resistors having values of 9K, 900 and 100 ohms, respectively. These resistive standards therefore divide down to 1 and 0.1 so that the gain of the buffer amplifier and ac converter can be determined at different levels.

When the Autocalibration cycle is initiated the instrument automatically makes 16 (A through S) internal autocalibration measurements. These measurements after modification are stoed as constants $A_1$ through $S_1$ of Table I in RAM memory.

The Universal correction equation is:

$$R_{CORR} = [\pm(|R_{UNCORR}| - 200) - X]Y.$$

where $R_{CORR}$ is the corrected and $R_{UNCORR}$ the uncorrected reading, and X and Y are variables derived from the 16 constants as a function of mode and range according to Table II. Complete information is given to the reader in FIG. 2 and Table IV for checking the validity of the equations shown. In the correction equations the $(1+E)^{-1} < 1-E$ approximation is used, where $E < 10^{-3}$. The resulting error is less than the resolution of the DMM. The subtraction of 200 counts above compensates for an intrinsic offset in the A/D Converter.

By necessity the AC corrections are the most complex. There we correct for DC gain, DC offset, and AC gain and offset of the RMS Converter. The near-zero non-linearity of the converter is not corrected for, but is kept within the AC accuracy specificatin of the DMM. On the other hand, if higher accuracy is desired, the non-linearity can be measured, and by the polynominal transformation feature, compensated for.

DIAGNOSTICS

Storing of the calibration constants is necessary not only for self-calibration but also for fault diagnosis. Each modified constant $A_1$ to $S_1$ has a predetermined range as shown in the Table below. This is the maximum expected drift in the constants due to aging, temperature and other factors. If the constant exceeds the present range, a diagnostic routine will indicate it by turning on a warning light. It is important to note that the instrument is capable of fully correcting for errors several times larger than the preset range. Nevertheless, if the error exceeds the normally expected maximum value, the cause should be investigated. The diagnostic light, therefore, could be considered an early warning signal showing anticipated failures as well as actual.

TABLE

Diagnostic Warning Limits of the Correction Constants as Percent of Full Scale

| | | | |
|---|---|---|---|
| $A_1$ | | $J_1$ | |
| $B_1$ | | $K_1$ | |
| $C_1$ | ±0.2% | $L_1$ | ±0.2% |
| $D_1$ | | $M_1$ | |
| $E_1$ | | $N_1$ | |
| $F_1$ | | $P_1$ | |
| $G_1$ | ±0.2% | $R_1$ | ±0.7% |
| $H_1$ | | $S_1$ | |

If the warning light is on, the first step is to remove the cover and operate the diagnostic switch. This calls up the diagnostic display routine, and at the push of an advance button displays the calibration constants on the normal readout, one by one. A trouble-shooting chart directs the operator to the failed or suspected board or component. Example: $N_1$, $P_1$, $R_1$, $S_1$, are out of range: defective RMS converter. The display feature has one additional use as well. During routine maintenance the constants can be inspected and, if close to a limit, even the anticipatory warning itself can be anticipated.

There are other diagnostic aides in the instrument in the form of 34 LED indicators to indicate the operational status and possible failure of other specific components. These additional LED status lights, though some are under software control are not evaluated by the software, i.e., they are not influencing the operation of the warning light. These LED's are additional visual troubleshooting aids with the help of charts. They provide continuous parallel display eliminating the need for most scope and DVM probing.

Most of the LED's are used to show which relays and FET switches are energized or are on. An early procedure in the diagnosis of an inoperative unit, and following review of the constants, is a review of the actual switch configuration against the setup table (Table IV). Discrepancies would indicate (1) failure of the transmission of selected range and function data to the CPU due to system I/O or input shift registers, (2) incorrect transmission of data to the range and function shift register due to optical couplers, ROM lookup table, shift register, or the relays.

One LED indicates presence of the cycle advance (or system timing) clock and its synchronizing pulse.

Another LED is used to confirm sampling of measurement of the input signal. The last LED displays the status of the high frequency clock gate used to measure time in the dual slope A/D Conversion system.

The lack of an indication on the last three LED's indicates failure of the CPU, ROM, or specific logic circuit board assemblies.

SWITCHING SYSTEM

The switches shown in FIG. 2 are used to set up normal measurements in all functions (i.e., VAC, VDC and Ω). They provide proper connection to various input Converters and Buffers. Attenuation and gain factors are also selected with these relays. They also configure the instrument to perform Autocalibration measurements. The switch setup table, FIG. 7, defines the setup for each range and measurement mode.

Relays K6, and 7 set DC Attenuation factors of 1 and 1/100. Relays K9 and 10 select gain settings of 1, 10 and 100 for the input Buffer amplifier. Relays K16, 17, 18, and 19 set the reference current for resistance measurements. Relays K17, 18, and 19 are also used to control the attenuation factors for the AC Converter. (1/10, 1/100 and 1/1000.)

A measurement of 100 VDC would dictate a setup as follows: Relay K4 connects the input to the DC Attenuator. K7 is closed to set up the ÷100 ratio tap and connect the IV signal to the Buffer amplifier. The gain is set to ×10 with K10. The amplifier output is connected to the A/D Converter.

Measurements in the AC Voltage mode are made in a similar manner with K11 connecting the input to the AC Attenuator and K12 which connects the AC Converter output to the input amplifier.

These relays also connect the internal voltage and resistance standards sequentially to the input conditioning circuits. The resultant measured data is ultimately used to correct subsequent measurements.

Relays K21, 22, 13, 14, 15, 1, 5, and FET switches S2, and S3 are used in the calibration of the AC and Ω Converters DC Attenuator and Amplifier. See Table IV for the relay setups used in the Autocalibration cycle.

S2, and S3 connect the 1.0 V and 0.1 V references to the input amplifier to measure the gain factors.

K13, 1, 4, and 7 set up the calibration of the DC Attenuator. The +10 V reference is applied to the top of the attenuator. The attenuator output voltage is normally +0.1 V. K9 is used to provide adequate gain to measure the attenuation factor. DC Offset is measured in the 0.1 V and 1 V ranges by closing K7 in conjunction with K9 and 10. This connects the amplifier input to signal low. The resultant output then represents amplifier offset. The reference divider is also used as the resistance standard for calibration of the Ω Converter. The 100 kΩ resistor in the DC Attenuator is used to calibrate the higher ranges.

Briefly, the above techniques are used to relate all previously critical components to a simple standard. The correction equations discussed elsewhere inpart a high level of accuracy to all measurements in spite of drift and long term aging of most of these components.

FLOW CHART

For general overview FIG. 3 shows the simplified flowchart of this invention. There is an automatic power on reset. From Start the program checks for any Autocalibrate request. After a preset number of measurements or on external command an Autocalibrate cycle is performed. Calibration constants are measured and stored and self diagnostics is performed. Subsequently all the remote or local mode, range, control and option conditions are loaded into RAM memory. After that, all the required relay and control flip-flops are set under software control. The next cycle is Measure. There is an Overflow check and if we are in the Autorange mode, depending on the size of the overflow, we change the range one up or to maximum.

The purpose is to optimize autoranging. A slow drift to overflow is likely to fall into the next range, but a severe overload causing saturation of the amplifier is best measured first at maximum range. This, as will be shown later, ultimately results in the fastest autoranging. If the overflow is occuring without autoranging or already on the maximum range, the Overflow display routing is called. Note that overflow readings are not corrected.

If no overflow occurs, the hardware counted least significant digits of the reference integration measurement are loaded into RAM. This is not shown in the simplified figures.

If on the right range, that is, readings between 1, X and 0.10X or on minimum or Hold range, then Correction test follows. If the reading is less, the software loop shifts down range once or several times according to the size of the reading. Since we have 5½ digits of information, even from maximum range the instrument can shift down exactly to the correct range in one step. As we have seen, upranging is achieved also in one step if it is certain that the reading is on the next scale up, or in maximum two steps, if severely overloaded. First a maximum range measurement is taken and then the instrument, as just shown, down ranges, if necessary several times, but always to the right range without taking any additional measurement. If a measurement is taken, we have the choice by an internal switch to display the uncorrected reading or to correct the value by the correction equation. The decision is made at Correction-test in the flowchart. After correction, the Data processing test is performed to see whether any or all of the optional data processing functions are required. After processing, if any, the net result of the measurement with correction factors applied is displayed by means of a display shift register and LED readouts. The data in optional parallel or serial format are also presented to the interface bus. Subsequently if no diagnostic display is required a new measurement cycle can start.

The described program occupies 2.5 kbyte of ROM not including 1.5 kbyte for the optional data processing functions.

Referring now to FIG. 3, the simplified flow chart of the microprocessor program, each of the flow chart blocks will now be described in detail. Such description will enable a skilled programmer to easily implement the flow chart in the language of the INTEL 4004 microprocessor programming language.

The instrument is initialized at turn-on, which is START, and the first thing that is tested is to determine whether an autocalibration routine is required; that is, is it necessary to determine all of the correction constants and store them in a RAM memory. This is done at turn-on and periodically based on the customer's preference or is remotely controllable.

The decision to autocalibrate sets up the relay patterns in Table III. The instrument then is sequenced through the steps A through S (under the heading FACTOR) setting up relays as noted. The data resulting from each of these measurements serve to characterize each of the input conditioning circuits in the instrument; typically (see FIG. 2) the AC converter, the ohms converter, the AC attenuator and the buffer amplifier gain in each of its gain settings. Following the auto-calibration cycle the instrument senses the control signals which set up the function of measurement function and initializes on one of the ranges.

A measurement is then taken and is noted in the MEASURE block. That measurement is tested for overflow. If the measurement is, in fact, an overflow reading, then MAX RANGE OR HOLD determines whether or not this is the highest range and therefore an unavoidable overflow, and if so, the OVERFLOW SIGN is indicated. If it is not on the maximum range or on range hold, then SMALL OVERFLOW will cause the instrument to up range by one range and a substantial overflow will cause the instrument to range to the highest range; for instance the 1,000 volt range AC. If it has been necessary to follow the foregoing loop in the flow chart then the instrument makes another measurement and performs the same test for the overflow condition which should no longer exist. If the reading is on scale, that is, not overflow, then it will test for underflow; in other words, is the reading too low to present an optimum reading without optimum resolution. If the reading is too low MINIMUM RANGE or HOLD is tested. If this condition is true, and therefore the range could be optimized by making it a more sensitive range, that range is directly determined by the reading just taken set up in the block SET CALCULATED RANGE and a measurement then is initiated again.

Summarizing the autoranging capability of the present invention if there is an underflow, the amount of underflow is sensed quantitatively and the proper range immediately directly selected without any intermediate steps. In the case of overflow a small overflow can be sensed to uprange one step as shown in the flow chart. If it is a large overflow, this cannot be directly sensed and thus the uprange is set to the maximum. Then a subsequent measure step is conducted where underflow will occur if the max range is not proper and the proper range may be directly selected. Thus in most cases as discussed above the proper range can be directly selected without intermediate steps.

Presumably all conditions are now met and it is possible to go through the flow chart for MEASURE, OVERFLOW, UNDERFLOW and down to CORRECTION REQUIRED. Correction is normally required and is only defeated for troubleshooting purposes. In the correction required routine, each of the readings is stored in RAM memory and modified based on equations and data shown in FIGS. 5 and 6. This operation is performed within the microprocessor system in a fairly straightforward manner utilizing normal data manipulation routines.

The correction equation of FIG. 6 is actually the revised format of the classical equation $Y=mX+b$; however, it is in the form $X=(Y-b) 1/m$ where the $1/m$ term is equivalent to Y and b is equivalent to X. Thus, X is an offset term and Y is a slope term.

When the data is corrected, the next question is DATA PROCESSING REQUIRED. And that is simply does the data need to be linearized based on special application programs, does the data need to be stored at high or low readings, does data need to be compared against high or low limits, etc. This is the time at which the data is manipulated or monitored for those purposes. Then the data is displayed either through the front panel display or remotely.

Another troubleshooting aid is the ability to display certain diagnostic data. Principally that is the display of the correction constants supplied in FIG. 5. After these constants are displayed the beginning of the flow chart is returned to for another measurement. Specifically with relation to the diagnostic display, the constants $A_1$ through $S_1$ when displayed are compared against prescribed limits and error is indicated in any particular constant by a marked variation from the limit.

For example, one example of the use of the diagnostic routine and display is as follows. Assume that the 100 volt range of the ac converter is not functioning properly and it erroneously reads the same as the one volt range. This would first of all show up as a major error in the constant $R_1$. A major error in the constant $R_1$ would indicate that perhaps relay 17B has failed or the resistor associated with that relay.

Furthermore if all of the ac constants are well outside of their limits it would be a clear indication that either the input was not connected to relay 11 or the ac converter output was not connected through relay 12 or the failure of the ac converter itself is indicated. Another example of the use of the modified correction constants as diagnostic tools is if a certain group of constants are all out of limit. For example if $H_1$, which is the 100 ohm scale factor correction constant, and $A_1$ the 0.1 volt dc gain constant, and furthermore the constants J1, K1 and L1 have all significant errors one can infer that these errors all relate back to one specific region; that is, since they all employ the use of relay 9 in the buffer amplifier and the 1 Kohm resistor connected to it, it would indicate that a failure of one of those two components or others in that area are the source of the difficulty.

Thus by the foregoing diagnostic technique the failures can be specifically pinpointed to one sector of the circuitry such as the buffer amplifier as discussed above.

CONCLUSION

We discussed some of the features of a Digital Multimeter, which for the first time in a single instrument, as opposed to larger systems, is capable of full self-calibration based on its own or external references. The instrument also monitors its calibration constants, and in case of unexpected drift, warns by a light of actual or anticipated failure of specific components sub-assemblies.

What is claimed is:

1. A method for rapid calibration of a microprocessor controlled digital multimeter having a set of analog components which can produce measurement errors and a subset of said components which are substantially more precise and removable comprising the following steps:

removing said subset of components;
replacing said subset with a previously calibrated equivalent subset; and
using said microprocessor and said equivalent subset to arithmetically remove the measurement errors caused by said set of analog components, wherein said arithmetical removal step is based on the precision of said previously calibrated equivalent subset.

* * * * *